(12) United States Patent
Hatasako et al.

(10) Patent No.: US 11,532,777 B2
(45) Date of Patent: Dec. 20, 2022

(54) THERMOELECTRIC POWER GENERATION SYSTEM

(71) Applicant: Yanmar Co., Ltd., Osaka (JP)

(72) Inventors: Yoshika Hatasako, Osaka (JP); Jiro Fukudome, Osaka (JP); Yuichiro Tanaka, Osaka (JP); Shuichi Nakagawa, Osaka (JP)

(73) Assignee: YANMAR POWER TECHNOLOGY CO., LTD., Osaka (JP)

( * ) Notice: Subject to any disclaimer, the term of this patent is extended or adjusted under 35 U.S.C. 154(b) by 750 days.

(21) Appl. No.: 16/344,759

(22) PCT Filed: Sep. 27, 2017

(86) PCT No.: PCT/JP2017/034919
§ 371 (c)(1),
(2) Date: Apr. 24, 2019

(87) PCT Pub. No.: WO2018/079172
PCT Pub. Date: May 3, 2018

(65) Prior Publication Data
US 2020/0091395 A1     Mar. 19, 2020

(30) Foreign Application Priority Data

Oct. 25, 2016    (JP) .............................. JP2016-208956

(51) Int. Cl.
*H01L 35/02*     (2006.01)
*H01L 35/32*     (2006.01)

(52) U.S. Cl.
CPC .............. *H01L 35/02* (2013.01); *H01L 35/32* (2013.01)

(58) Field of Classification Search
CPC ................................ H01L 35/02; H01L 35/32
See application file for complete search history.

(56) References Cited

U.S. PATENT DOCUMENTS

2015/0228882 A1*   8/2015   Takahashi ............... H01L 35/32
                                                                                                                                   136/209

FOREIGN PATENT DOCUMENTS

JP       2005-117836 A     4/2005
JP       2007-014084 A     1/2007
(Continued)

OTHER PUBLICATIONS

International Search Report dated Oct. 31, 2017 issued in corresponding PCT Application PCT/JP2017/034919.

*Primary Examiner* — Tae-Sik Kang
(74) *Attorney, Agent, or Firm* — Norton Rose Fulbright US LLP

(57) ABSTRACT

A thermoelectric power generation device including: a heating unit having a heat medium passage in which a heat medium flows; a cooling unit having a cooling liquid passage in which a cooling liquid flows; a thermoelectric element having the heating unit and the cooling unit so as to generate power by utilizing a temperature difference between a condensation temperature of the heat medium and a temperature of the cooling liquid; a power generation output detection unit configured to detect a power generation output of the thermoelectric element; a heat medium pressure detection unit configured to detect a pressure of the heat medium; a storage unit for storing, in advance, a relationship between a power generation output of the thermoelectric element and the pressure of the heat medium; and an abnormality detection unit configured to detect an abnormality taking place in the thermoelectric power generation device.

11 Claims, 11 Drawing Sheets

(56) References Cited

FOREIGN PATENT DOCUMENTS

| | | |
|---|---|---|
| JP | 2007-014161 A | 1/2007 |
| JP | 2013-172576 A | 9/2013 |
| JP | 2015-012173 A | 1/2015 |
| JP | 2015-165555 A | 9/2015 |

* cited by examiner

THERMOELECTRIC POWER GENERATION SYSTEM

CROSS REFERENCES TO RELATED APPLICATIONS

This application is a national stage application pursuant to 35 U.S.C. § 371 of International Application No. PCT/JP2017/034919, filed on Sep. 27, 2017, which claims priority under 35 U.S.C. § 119 to Japanese Patent Application No. 2016-208956, filed on Oct. 25, 2016, the disclosures of which are hereby incorporated by reference in their entireties

TECHNICAL FIELD

The present invention relates to a thermoelectric power generation device which generates power by utilizing a temperature difference.

BACKGROUND ART

An example of such a type of traditional thermoelectric power generation device is disclosed in Patent Literature 1 (hereinafter referred to as PTL 1). PTL 1 discloses a thermoelectric power generation device including a heating unit having a heat medium passage on one surface of a thermoelectric element and a cooling unit having a coolant passage on the other surface of the thermoelectric element, the device being configured to generate power by utilizing a temperature difference between a heat medium flowing in the heat medium passage and a coolant flowing in the coolant passage.

Further, Patent Literature 2 (hereinafter, referred to as PTL 2) discloses a structure for detecting an abnormality in a thermoelectric power generation device mounted in a vehicle, based on an estimated power generation amount corresponding to an engine speed or the speed of the vehicle, and an actual power generation amount.

CITATION LIST

Patent Literature

PTL 1: Japanese Patent Application Laid-Open No. 2015-012173
PTL 2: Japanese Patent Application Laid-Open No. 2007-014161

SUMMARY OF INVENTION

Technical Problem

In a traditional thermoelectric power generation device such as the one disclosed in PTL 1 and PTL 2, a high-temperature liquid or gas is supplied as a heat medium into a heat medium passage. In such a structure, the heat medium flowing in the heat medium passage is in the same phase, and therefore the heat medium undergoes sensible heat transfer. In other words, the temperature changes while the heat medium flows in the heat medium passage.

Meanwhile, the inventors of the present invention have found that, by causing a phase transition of the heat medium (e.g. from gas to liquid) while the heat medium flows in the heat medium passage, the temperature of the heat medium can be constant and the power generation amount can be improved. In other words, during the latent heat transfer of the heat medium, the condensation temperature of the heat medium is constant, and by utilizing this, the inventors of the present invention have found that the power generation amount can be improved.

Meanwhile, a thermoelectric power generation device is expected to be used for a long period of time of approximately several years to several tens of years. During this long-term usage, the power generation output may abnormally be lowered, due to a failure of any of the parts of the thermoelectric power generation device, leakage of the cooling liquid, and the like. For this reason, a thermoelectric power generation device preferably has a structure for detecting an abnormality as described in PTL 2.

However, PTL 2 premises use of a heat medium that undergoes sensible heat transfer, and does not assume the use of a heat medium that undergoes latent heat transfer. Therefore, a traditional thermoelectric power generation device still leaves a room for improvement in terms of more reliable detection of an abnormality in the thermoelectric power generation device.

To achieve the above problem, the present invention is made, and it is an object of the present invention to provide a thermoelectric power generation device that can more reliably detect an abnormality in the thermoelectric power generation device.

Solution to Problem

A thermoelectric power generation device related to an aspect of the present invention includes:

a heating unit having a heat medium passage in which a heat medium flows;

a cooling unit having a cooling liquid passage in which a cooling liquid flows; and a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, the thermoelectric power generation device further including a power generation output detection unit configured to detect a power generation output of the thermoelectric element;

a heat medium pressure detection unit configured to detect a pressure of the heat medium or a heat medium temperature detection unit configured to detect a temperature of the heat medium;

a storage unit for storing, in advance, a relationship between a power generation output of the thermoelectric element and the pressure or the temperature of the heat medium, when the thermoelectric power generation device is in a normal state; and an abnormality detection unit configured to detect that an abnormality is taking place in the thermoelectric power generation device, when a relationship between the power generation output detected by the power generation output detection unit and the pressure detected by the heat medium pressure detection unit or the temperature detected by the heat medium temperature detection unit is different from the relationship stored in the storage unit.

Further, a thermoelectric power generation device related to another aspect of the present invention includes:

a heating unit having a heat medium passage in which a heat medium flows;

a cooling unit having a cooling liquid passage in which a cooling liquid flows; and a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, the thermoelectric power generation device further including a power generation output detection unit configured to detect a power generation output of the thermoelectric element;

a heat medium temperature detection unit configured to detect a temperature of the heat medium;

a cooling liquid temperature detecting unit configured to detect a temperature of the cooling liquid;

a storage unit for storing, in advance, a relationship between a power generation output of the thermoelectric element and a difference between the temperature of the heat medium and the temperature of the cooling liquid, when the thermoelectric power generation device is in a normal state; and an abnormality detection unit configured to detect that an abnormality is taking place in the thermoelectric power generation device, when a relationship between the power generation output detected by the power generation output detection unit and the difference between the temperature detected by the heat medium temperature detection unit and the temperature detected by the cooling liquid temperature detecting unit is different from the relationship stored in the storage unit.

Further, a thermoelectric power generation device related to another aspect of the present invention includes: a heating unit having a heat medium passage in which a heat medium flows;

a cooling unit having a cooling liquid passage in which a cooling liquid flows; and a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, the thermoelectric power generation device further including a power generation output detection unit configured to detect a power generation output of the thermoelectric element;

a heat medium temperature detection unit configured to detect the temperature of the heat medium;

a heat exchange amount detection unit configured to detect a heat exchange amount of the cooling liquid;

a storage unit for storing, in advance, a relationship between a power generation output of the thermoelectric element and a heat exchange amount of the cooling liquid, when the thermoelectric power generation device is in a normal state; and an abnormality detection unit configured to detect that an abnormality is taking place in the thermoelectric power generation device, when a relationship between the power generation output detected by the power generation output detection unit and the heat exchange amount detected by the heat exchange amount detection unit is different from the relationship stored in the storage unit.

Further, a thermoelectric power generation device related to another aspect of the present invention includes:

a heating unit having a heat medium passage in which a heat medium flows;

a cooling unit having a cooling liquid passage in which a cooling liquid flows;

a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid; and a heat transfer pipe arranged in a flow path to serve as a heat source, and communicated with the heat medium passage to form a circulation path in which the heat medium is circulated, the thermoelectric power generation device further including a heat source temperature detection unit configured to detect a heat source temperature;

a heat medium pressure detection unit configured to detect a pressure of the heat medium or a heat medium temperature detection unit configured to detect a temperature of the heat medium;

a storage unit for storing, in advance, a relationship between the heat source temperature and the pressure or the temperature of the heat medium, when the thermoelectric power generation device is in a normal state; and an abnormality detection unit configured to detect that an abnormality is taking place in the thermoelectric power generation device, when a relationship between the temperature detected by the heat source temperature detection unit and the pressure detected by the heat medium pressure detection unit or the temperature detected by the heat medium temperature detection unit is different from the relationship stored in the storage unit.

Further, a thermoelectric power generation device related to another aspect of the present invention includes:

a heating unit having a heat medium passage in which a heat medium flows;

a cooling unit having a cooling liquid passage in which a cooling liquid flows;

a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid; and a heat transfer pipe arranged in a flow path to serve as a heat source, and communicated with the heat medium passage to form a circulation path in which the heat medium is circulated, the thermoelectric power generation device further including a heat source temperature detection unit configured to detect a heat source temperature;

a heat exchange amount detection unit configured to detect a heat exchange amount of the cooling liquid;

a storage unit for storing, in advance, a relationship between the heat source temperature and the heat exchange amount, when the thermoelectric power generation device is in a normal state; and an abnormality detection unit configured to detect that an abnormality is taking place in the thermoelectric power generation device, when a relationship between the temperature detected by the heat source temperature detection unit and the heat exchange amount detected by the heat exchange amount detection unit is different from the relationship stored in the storage unit.

Further, a thermoelectric power generation device related to another aspect of the present invention includes:

a heating unit having a heat medium passage in which a heat medium flows;

a pair of cooling units each having a cooling liquid passage in which a cooling liquid flows; and a pair of thermoelectric elements each having the heating unit on one side and one of the pair of cooling units on another side, the thermoelectric element configured to generate power by utilizing a temperature difference between a condensation temperature of the heat medium that undergoes latent heat transfer in the heat medium passage and a temperature of the cooling liquid, wherein the pair of thermoelectric elements are arranged to face each other over the heating unit;

the pair of cooling units are arranged to face each other over the heating unit and the pair of thermoelectric elements; and the thermoelectric power generation device further includes an abnormality detection unit configured to detect that an abnormality is taking place in the thermoelectric power generation device, when a difference between a power generation output of one of the pair of thermoelectric elements and a power generation output of the other one of the pair of thermoelectric elements is equal to or higher than a predetermined threshold value.

Advantageous Effects of Invention

With the thermoelectric power generation device of the present invention, an abnormality in the thermoelectric power generation device can be more reliably detected.

DESCRIPTION OF EMBODIMENTS

The following describes embodiments with reference to attached drawings. In each of the drawings, elements are exaggerated for the sake of easier understanding.

Embodiment 1

[Basic Structure]

A basic structure of a thermoelectric power generation device related to Embodiment 1 is described.

Figure 1A:
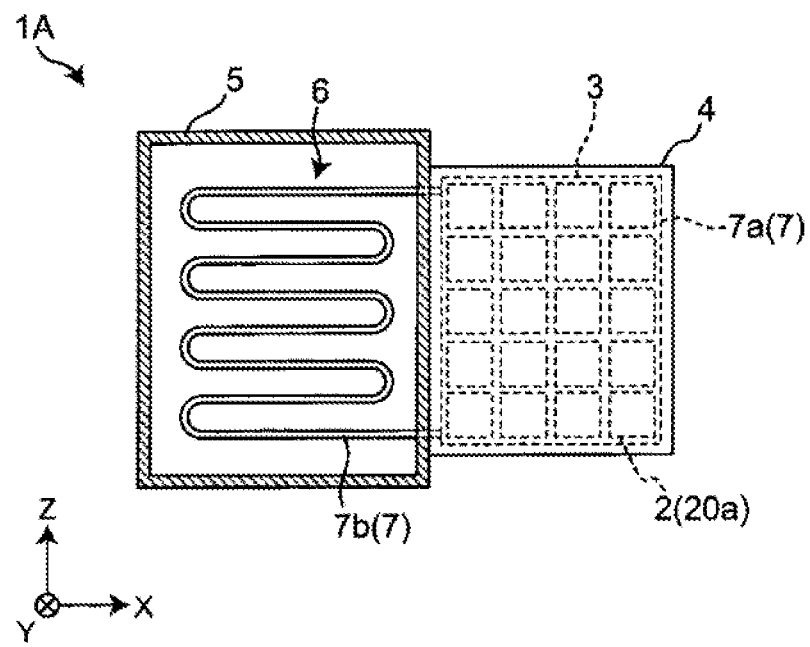
FIG. 1A A diagram showing a schematic structure of a thermoelectric power generation device related to Embodiment 1 of the present invention.
Figure 1B:
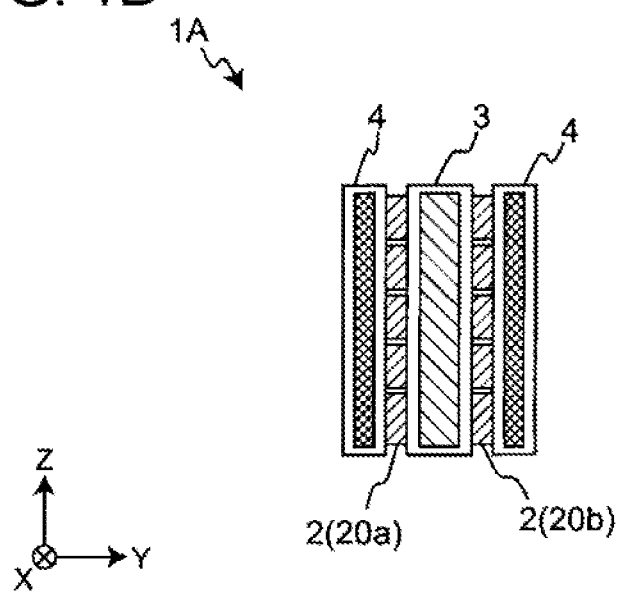
FIG. 1B A diagram showing a schematic structure of the thermoelectric power generation device related to Embodiment 1 of the present invention as viewed from behind.

FIG. 1A shows a schematic structure of a thermoelectric power generation device 1 related to Embodiment 1. The directions X, Y, and Z in FIG. 1A indicate the longitudinal direction, lateral direction, and the height direction of the thermoelectric power generation device 1A, respectively. The longitudinal direction, the lateral direction, and the height direction mean the length direction, short direction, and the up-down direction of the thermoelectric power generation device 1A, respectively. FIG. 1B is a diagram showing a schematic structure of the thermoelectric power generation device 1A as viewed from behind (in X direction).

As shown in FIG. 1A and FIG. 1B, the thermoelectric power generation device 1A includes a thermoelectric element 2 in which a heating unit 3 is provided on one surface and a cooling unit 4 is provided on the other surface. In Embodiment 1, the thermoelectric elements 2 are provided on both sides of the heating unit 3, and the cooling units 4 are provided on both sides of the heating unit 3 so as to face each other across the thermoelectric elements 2. That is, the thermoelectric power generation device 1A includes a pair of thermoelectric elements 2 arranged to face each other over the heating unit 3, and a pair of cooling units 4 arranged to face each other over the heating unit 3 and the pair of thermoelectric element 2. Further, in Embodiment 1, the heating unit 3 is connected to a heat transfer pipe 6 arranged in a flow path 5 in which a high temperature fluid flows.

<Thermoelectric Element>

The thermoelectric element 2 is an element having two surfaces, i.e., one surface on which the heating unit 3 is provided (the high-temperature side) and the other surface on which the cooling unit 4 is provided (on the low-temperature side). In the thermoelectric element 2, the heating unit 3 heats the one surface and the cooling unit 4 cools the other surface, thereby generating power using the temperature difference. The thickness of the thermoelectric element 2 is designed to be smaller than the size (width) of the first side and the second side of the thermoelectric element 2. Specifically, the thermoelectric element 2 is formed in a plate shape. In Embodiment 1, thermoelectric modules 20a and 20b each having a plurality of serially connected thermoelectric elements 2 are attached to both sides of the heating unit 3. Specifically, on both sides of the heating unit 3, the thermoelectric modules 20a, 20b each having 20 thermoelectric elements 2 of four columns×five rows are attached. The number of thermoelectric elements 2 is not limited to this. For example, the thermoelectric power generation device 1A may have one thermoelectric element 2 attached to each of both sides of the heating unit 3.

<Heating Unit>

The heating unit 3 is made of a metal material with excellent thermal conductivity. The heating unit 3 is formed in a plate shape, which contacts first sides of the thermoelectric elements 2. The heating unit 3 is connected to the heat transfer pipe 6. The heating unit 3 and the heat transfer pipe 6 have internal spaces 7a, 7b communicating with each other. In the internal space 7a of the heating unit 3 and the internal space 7b of the heat transfer pipe 6, a heat medium is enclosed. Further, the internal space 7a of the heating unit 3 and the internal space 7b of the heat transfer pipe 6 form a circulation path 7 in which the heat medium is circulated. That is, the heat transfer pipe 6 communicates with the heat medium passage to form a circulation path 7 in which heat medium is circulated.

The heat transfer pipe 6 is arranged in the flow path 5 to serve as a heat source and vaporizes the heat medium flowing in the internal space 7b which is a part of the circulation path 7, by using the heat of the high temperature fluid flowing in the flow path 5. That is, the heat transfer pipe 6 functions as a vaporizing unit for vaporizing the heat medium. The heating unit 3 condenses the heat medium vaporized in the internal space 7b of the heat transfer pipe 6. That is, the heating unit 3 functions as a condensing unit for condensing the heat medium. In Embodiment 1, water is used as the heat medium. Further, the flow path 5 is, for example, an engine duct of exhaust gas through which a high-temperature exhaust gas flows. In the flow path 5, the high temperature fluid flows in a direction towards the paper surface of FIG. 1A, i.e., in the Y direction. The flow path 5 may be, for example, a high-temperature environment such as an industrial waste furnace or a biomass boiler, or a radiation field not requiring convection, in addition to the exhaust gas duct of an engine.

Figure 2:
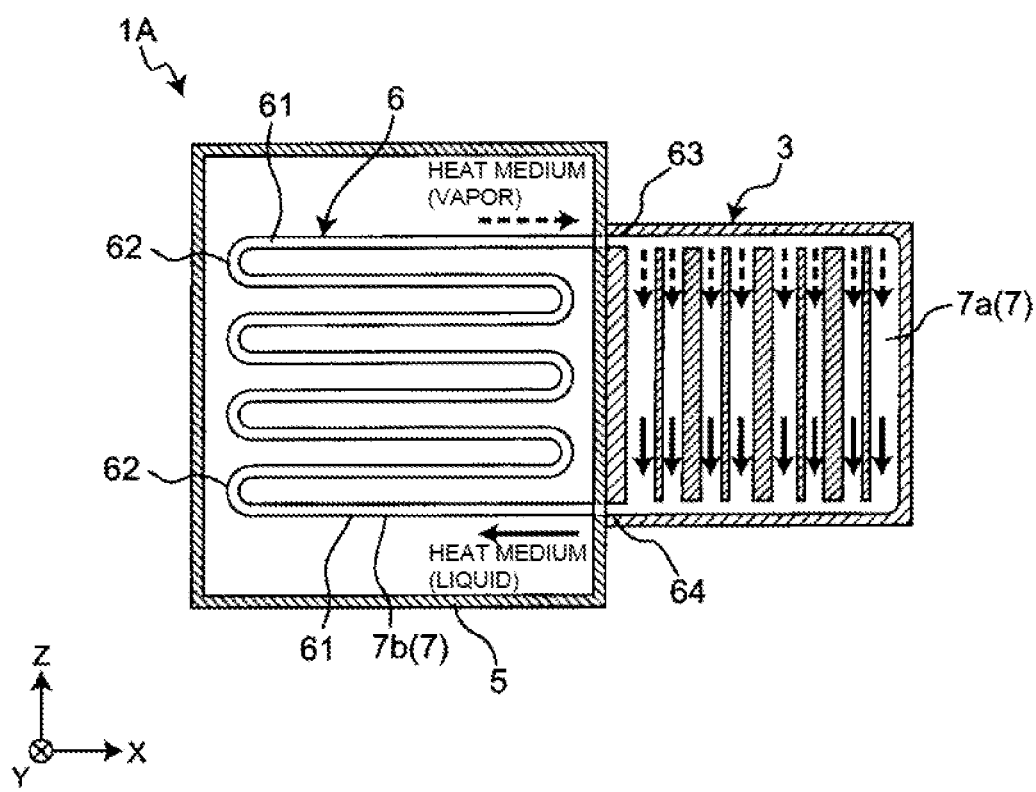
FIG. 2 A diagram showing a schematic structure of a heating unit of the thermoelectric power generation device related to Embodiment 1 of the present invention.

FIG. 2 shows a schematic structure of the heating unit 3 and the heat transfer pipe 6 of the thermoelectric power generation device 1A. As shown in FIG. 2, the heat transfer pipe 6 is structured so as to have a large contact area with the high temperature fluid flowing in the flow path 5, when viewed in the direction in which the high temperature fluid flows, i.e., the Y direction. Specifically, the heat transfer pipe 6 has a plurality of tubular members 61 extending in the X direction and a plurality of bent portions 62 connecting the tubular members 61 to each other, as viewed from the Y direction. The plurality of tubular members 61 are arranged with a predetermined interval in the Z direction and their end portions are connected through the bent portions 62, when viewed in the Y direction. With the plurality of tubular members 61 connected through the bent portions 62 as described, the heat transfer pipe 6 forms a continuous pipe having a plurality of bent portions.

In the internal space 7a of the heating unit 3, a heat medium passage in which the heat medium flows is formed. In Embodiment 1, the heat medium passage is formed so that the heat medium spreads throughout the entire heating surface of the thermoelectric element 2. Specifically, as shown in FIG. 2, a plurality of heat medium passages extending in the Z direction are formed in the internal space 7a of the heating unit 3. The heat medium passages in the internal space 7a of the heating unit 3 may be, for example, inclined towards the X direction, as long as the heat medium flows in the direction of gravity.

<Circulation Path>

The circulation path 7 is formed through the internal space 7a of the heating unit 3 and the internal space 7b of the heat transfer pipe 6. The heat medium circulates in the internal space 7a of the heating unit 3 and the internal space 7b of the heat transfer pipe 6. Specifically, when the heat transfer pipe 6 is heated by the high temperature fluid flowing in the flow path 5, the liquid heat medium flowing in the heat transfer pipe 6 is turned into vapor. In other words, the heat medium is vaporized in the internal space 7b of the heat transfer pipe 6 and the phase of the heat medium changes from liquid to gas. The vapor is discharged from an opening end portion 63 in a high position of the heat transfer pipe 6 to the heat medium passage in the internal space 7a of the heating unit 3. The vapor discharged into the heat medium passage in the internal space 7a of the heating unit 3 falls in the direction of gravity while being poured onto the heating surface of the heating unit 3, and is condensed by radiating heat from the heating surface to heat the thermoelectric elements 2. In other words, the phase of the heat medium changes from gas to liquid in the internal space 7a of the heating unit 3. That is, the heat medium undergoes latent heat transfer, and the condensation temperature of the heat medium is constant. The heat medium condensed flows from an open end portion 64 in a low position of the heat transfer pipe 6 into the heat medium passage in the internal space 7b of the heat transfer pipe 6. The heat medium having flowed into the internal space 7b of the heat transfer pipe 6 is again heated by the high temperature fluid flowing into the flow path 5, and the phase of the heat medium is changed from liquid to gas. As described, the heat medium spontaneously circulates in the circulation path 7 formed by the internal space 7a of the heating unit 3 and the internal space 7b of the heat transfer pipe 6. In other words, by using the phase change of the heat medium, the heat medium is repeatedly circulated in the circulation path 7 formed by the internal space 7a of the heating unit 3 and the internal space 7b of the heat transfer pipe 6, without power of a pump and the like.

<Cooling Unit>

The cooling units 4 are each made of a metal material with excellent thermal conductivity. The cooling units 4 are formed in a plate shape, which contact the second sides of the thermoelectric elements 2. Further, inside each of the cooling units 4, a cooling liquid passage in which a cooling liquid flows is formed.

Figure 3:
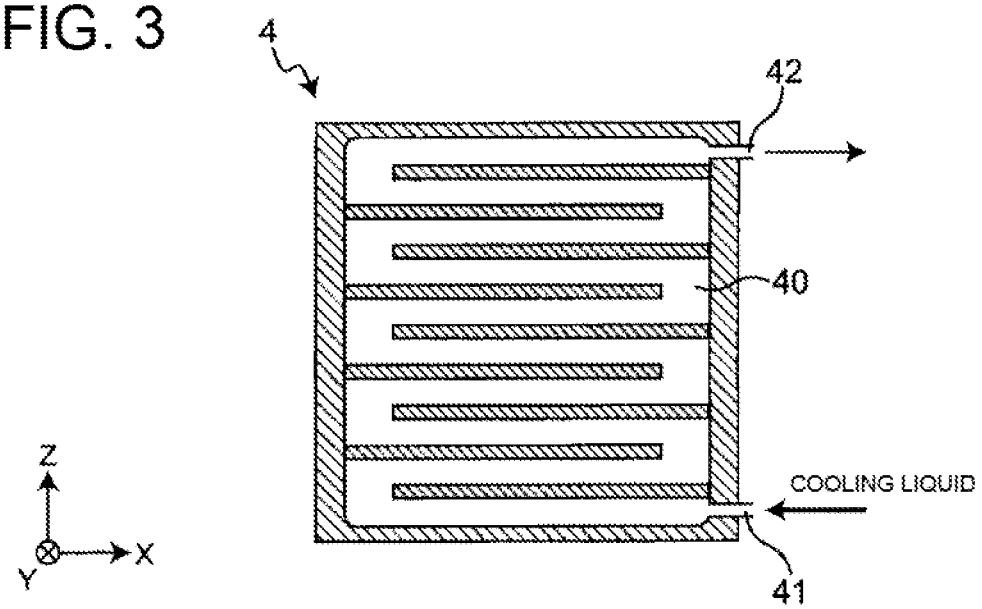
FIG. 3 A diagram showing a schematic structure of a cooling unit of the thermoelectric power generation device related to Embodiment 1 of the present invention.
Figure 4:
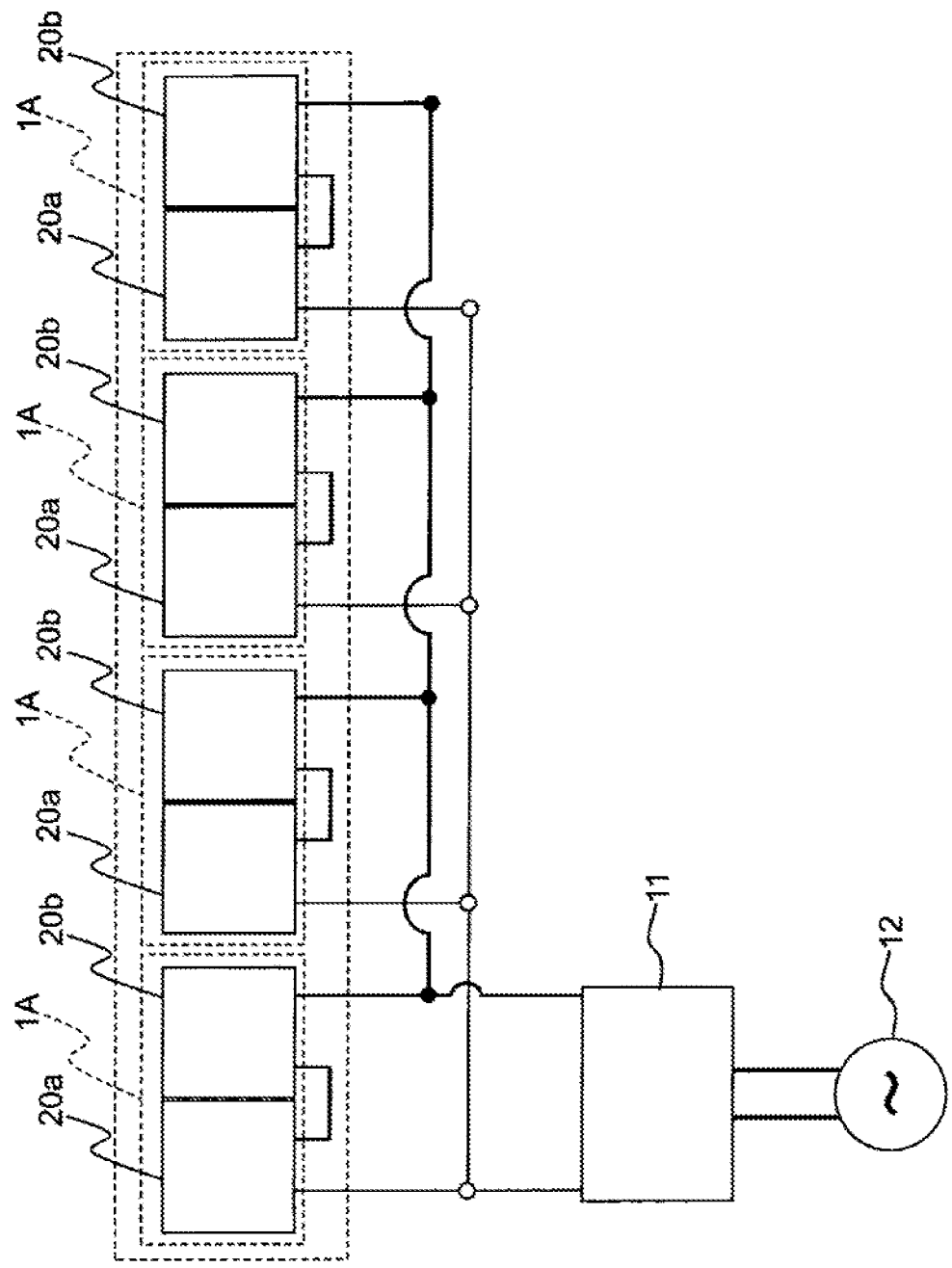
FIG. 4 A schematic diagram of an electric system of a thermoelectric power generation system using the thermoelectric power generation device related to Embodiment 1 of the present invention.

FIG. 3 shows a schematic structure of the cooling unit 4 of the thermoelectric power generation device 1A. As shown in FIG. 3, inside the cooling unit 4, a plate-shape cooling liquid passage 40 is formed in such a manner that the cooling liquid is spread throughout the entire cooling surface of the cooling unit 4 which contacts the thermoelectric element 2. Specifically, the cooling liquid passage 40 has a plurality of passages extending in the X direction, which are connected with one another. The cooling liquid passage 40 is provided with a cooling liquid inflow pipe 41 on its low side, and a cooling liquid discharge pipe 42 on its high side. The cooling liquid having flowed from the cooling liquid inflow pipe 41 into the cooling liquid passage 40 cools the cooling surface in contact with the second side of the thermoelectric element 2, and then discharged from the cooling liquid discharge pipe 42. Although the cooling liquid passage 40 in Embodiment 1 is formed in a plate shape such that the cooling liquid spreads throughout the entire cooling surface in contact with the thermoelectric element 2, the shape of the cooling liquid passage 40 is not limited as long as the second side of the thermoelectric element 2 is entirely and evenly cooled. Further, the plurality of passages of the cooling liquid passage 40 inside the cooling unit 4 may extend not only in the X direction but also in the Z direction. In Embodiment 1, water is used as the cooling liquid.

<Electric System>

Figure 5:
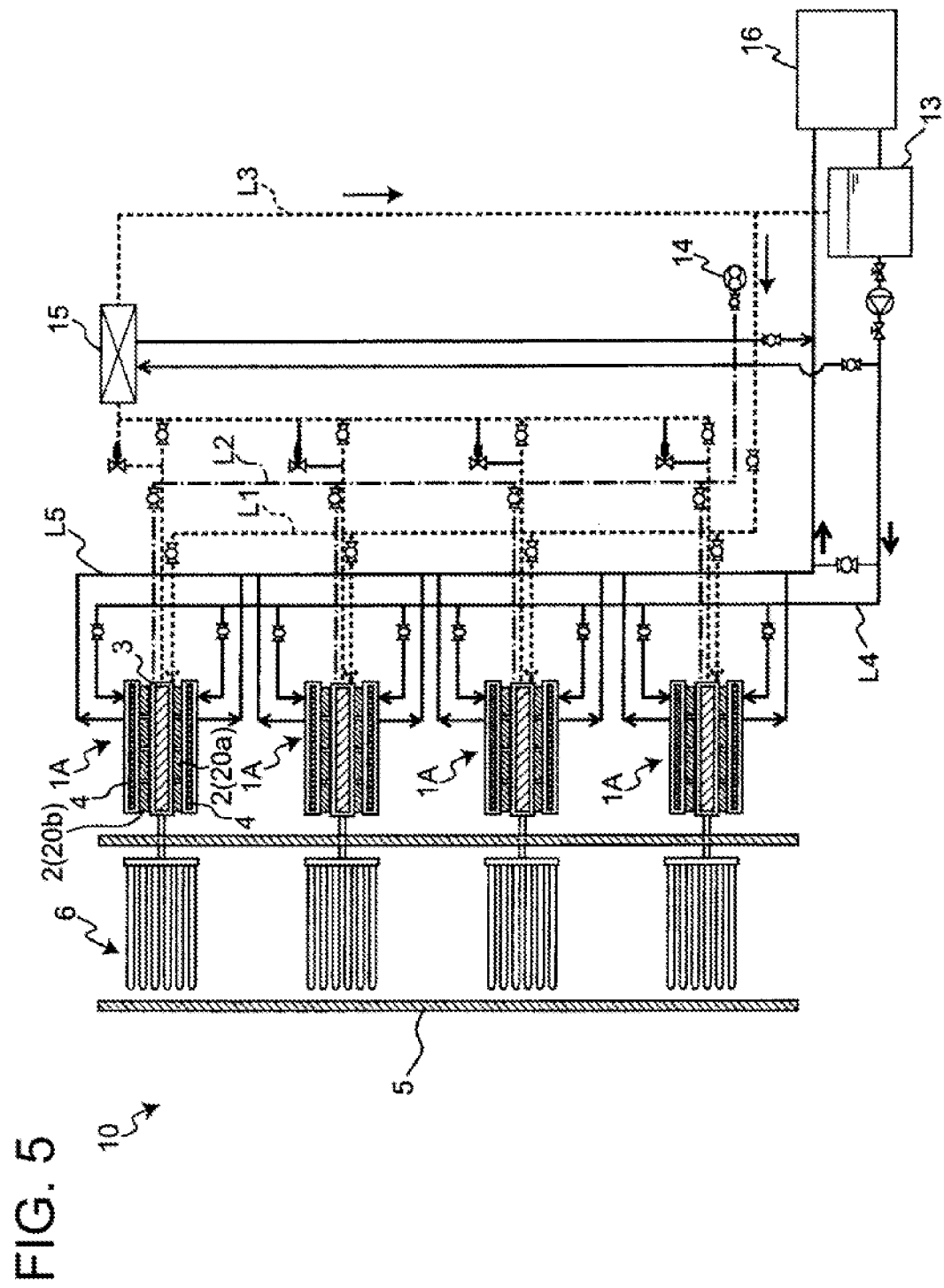
FIG. 5 A schematic diagram of a heat medium system of the thermoelectric power generation system using the thermoelectric power generation device related to Embodiment 1 of the present invention.

FIG. 5 is a schematic diagram of an electric system of a thermoelectric power generation system 10. As shown in FIG. 5, the thermoelectric power generation system 10A includes: four thermoelectric power generation devices 1, an inverter 11, and an electric load 12. In the thermoelectric power generation system 10, the four thermoelectric power generation devices 1A are connected in parallel. The four thermoelectric power generation devices 1A connected in parallel are connected to the inverter 11. The inverter 11 is connected to the electric load 12. In the thermoelectric power generation system 10, power generated by the four thermoelectric power generation devices 1A is supplied to the electric load 12 through the inverter 11.

<Heat Medium System>

Figure 6:
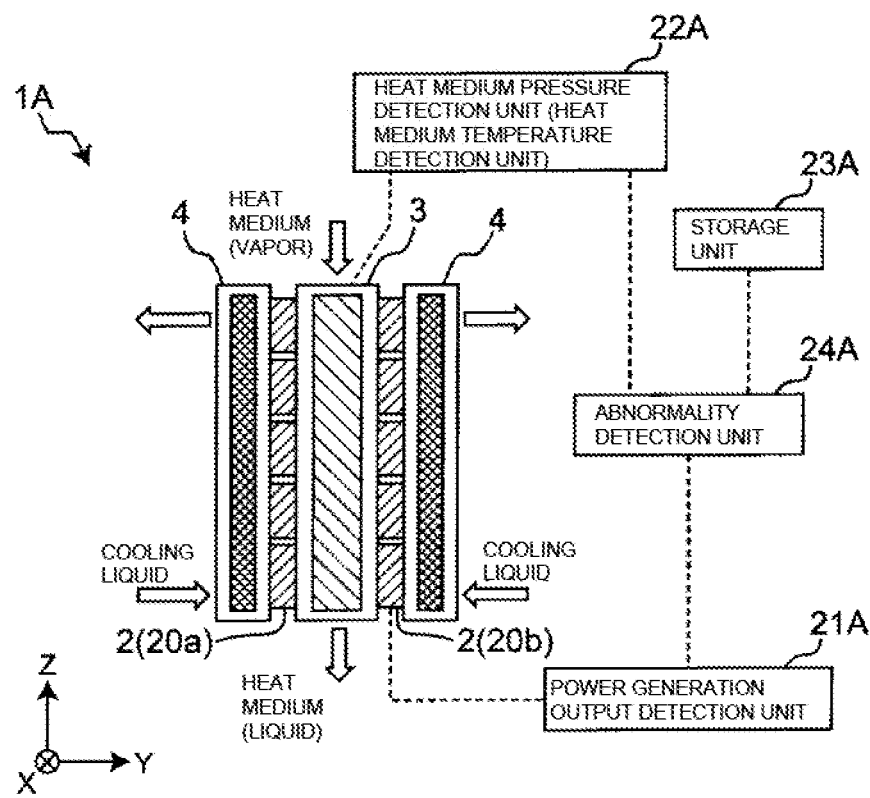
FIG. 6 A diagram showing an abnormality detection structure of a thermoelectric power generation device related to Embodiment 1 of the present invention.

FIG. 6 is a schematic diagram of a heat medium system of a thermoelectric power generation system 10. In FIG. 6, the dotted line and the one dot chain line indicate the line of the heat medium, and the solid line indicates the line of the cooling liquid. First, a flow of the heat medium is described. As shown in FIG. 6, the heat medium lines L1, L2, and L3 are connected to the heating unit 3 of the thermoelectric power generation device 1A. To the heat medium lines L1, L2, and L3, valves are provided respectively. While the heat medium spontaneously circulates inside the heating unit 3, the heat medium lines L1, L2, L3 are closed. The valve provided to the heat medium line L3 is a pressure valve.

The heat medium line L1 is a line for filling water to become the heat medium. To supply the heat medium inside the heating unit 3, the valve of the heat medium line L1 is opened to supply the heat medium from a tank 13 into the heating unit 3, through the heat medium line L1.

The heat medium line L2 is a line for evacuation using a vacuum pump 14. Evacuation is performed by using the vacuum pump 14 through the heat medium line L2, while the heating unit 3 has no heat medium. After the evacuation, the heat medium in the tank 13 is supplied inside the heating unit 3 through the heat medium line L1.

The heat medium line L3 is a line for discharging the heat medium inside the heating unit 3 to the tank 13. When the vapor pressure inside the heating unit 3 becomes higher than the tolerance of the pressure valve of the heat medium line L3, the pressure valve opens and the vapor inside the heating unit 3 is discharged to the heat medium line L3. The heat medium discharged from the heating unit 3 flows in the heat medium line L3, and is discharged to the tank 13 through a heat exchanger 15. Since water is used as the heat medium and as the cooling liquid in Embodiment 1, the cooling liquid and the heat medium can be stored in the tank 13.

Next, a flow of the cooling liquid is described. As shown in FIG. 6, the cooling liquid flows from the tank 13 to the cooling unit 4 through a cooling liquid line L4, with the use of a pump and the like. The cooling liquid having flowed into the cooling unit 4 flows to a cooling installation 16 through a cooling liquid line L5. The cooling installation 16 is, for example, a cooling tower for cooling the cooling liquid. The cooling liquid cooled in the cooling installation 16 is stored in the tank 13.

<Abnormality Detection>

Next, a structure for detecting an abnormality in the thermoelectric power generation device 1A is described.

FIG. 6 shows an abnormality detection structure of the thermoelectric power generation device 1A. As shown in FIG. 6, the thermoelectric power generation device 1A includes a power generation output detection unit 21A, a heat medium pressure detection unit 22A, a storage unit 23A, and an abnormality detection unit 24A.

The power generation output detection unit 21A detects the power generation output of the thermoelectric element 2. The "power generation output" is an output of the thermoelectric element 2 associated with power generation, such as voltage, current, potential, power generation amount, and the like. The power generation output detection unit 21A is, for example, a voltmeter, an ammeter, an electrometer, and a power generation amount meter.

The heat medium pressure detection unit 22A detects the pressure of the heat medium flowing in the heat medium passage of the heating unit 3. The heat medium pressure detection unit 22A is, for example, a pressure sensor.

Figure 7:
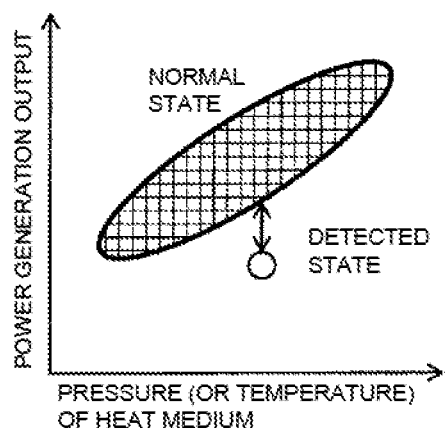
FIG. 7 A graph showing a relationship between the power generation output of the thermoelectric element and the pressure (or temperature) of the heat medium, in the normal state and the detected state.

The storage unit 23A stores, in advance, a relationship (e.g., a relational expression or a map) between the power generation output of the thermoelectric element 2 and the pressure of the heat medium, while the thermoelectric power generation device 1A is in a normal state. The "normal state" refers to a state free of an abnormality such as a failure in any of the various components of the thermoelectric power generation device 1A, leakage of cooling liquid, and the like. Generally, the power generation output of a thermoelectric power generation device 1A drops due to aging and the like, even if the pressure of the heat medium is the same. As shown in FIG. 7, the "normal state" is preferably set in consideration of the drop in the power generation output attributed to aging and the like.

The abnormality detection unit 24A detects that an abnormality is taking place in the thermoelectric power generation device 1A, when a relationship between the power generation output detected by the power generation output detection unit 21A and the pressure detected by the heat medium pressure detection unit 22A is different from the relationship stored in the storage unit 23A. For example, the abnormality detection unit 24A obtains the relationship (detected state) between the power generation output detected by the power generation output detection unit 21A and the pressure detected by the heat medium pressure detection unit 22A. As shown in FIG. 7, the abnormality detection unit 24A detects that an abnormality is taking place in the thermoelectric power generation device 1A, when the detected state obtained is different from the relationship stored in the storage unit 23A, i.e., when the detected state is outside of the range of the normal state. For example, suppose that the normal state is a state when the pressure of the heat medium is 1.2 MPa and the power generation output of the thermoelectric element 2 is 180 W or higher but not higher than 200 W. In this case, the abnormality detection unit 24A detects that an abnormality is taking place in the thermoelectric power generation device 1A, if the pressure detected by the heat medium pressure detection unit 22A is 1.2 MPa and the power generation output detected by the power generation output sensing part 21A is 150 W.

When the abnormality in the thermoelectric power generation device 1A is detected, the abnormality detection unit 24A notifies the user of the abnormality, for example, by means of alarming in the form of sound and display. This way, the abnormality in the thermoelectric power generation device 1A can be recognized by the user.

[Effects]

The thermoelectric power generation device 1A related to Embodiment 1 brings about the following effects.

The thermoelectric power generation device 1A is configured to detect an abnormality in the thermoelectric power generation device 1A, based on whether or not the relationship between the power generation output of the thermoelectric element 2 and the pressure of the heat medium is in the normal state. With this structure, an abnormality in the thermoelectric power generation device 1A can be more reliably detected even in cases of utilizing a heat medium that undergoes latent heat transfer, in the heating unit 3.

It should be noted that Embodiment 1 deals with a thermoelectric power generation system 10 having four thermoelectric power generation devices 1A; however, the present invention is not limited to this, as long as the thermoelectric power generation system 10 includes at least one thermoelectric power generation device 1A.

Although Embodiment 1 adopts water as the heat medium and the cooling liquid, the present invention is not limited to this. The heat medium and the cooling liquid may be different. Any heat medium may be adopted provided that the heat medium can change its phase between gas and liquid in the circulation path 7. Any given liquid may be adopted as a cooling liquid, provided that cooling is possible.

Although Embodiment 1 deals with a case where the thermoelectric element 2 is provided to one side of the heating unit 3, the present invention is not limited to this. For example, the thermoelectric element 2 may be provided on a surface of only one side of the heating unit 3.

Since the pressure of the heat medium is proportional to the temperature of the heat medium, the thermoelectric power generation device 1A may be configured to detect an abnormality in the thermoelectric power generation device 1A, based on whether or not the relationship between the power generation output of the thermoelectric element 2 and the temperature of the heat medium is in the normal state. Specifically, a heat medium temperature detection unit configured to detect the temperature of the heat medium may be provided instead of the heat medium pressure detection unit 22A. In this case, the storage unit 23A may store, in advance, a relationship between the power generation output of the thermoelectric element 2 and the temperature of the heat medium, while the thermoelectric power generation device 1A is in the normal state. Further, the abnormality detection unit 24A may be configured to detect that an abnormality is taking place in the thermoelectric power generation device 1A, when the relationship between the power generation output detected by the power generation output detection unit 21A and the temperature detected by the heat medium temperature detection unit is different from the relationship stored in the storage unit 23A.

Embodiment 2

[Overall Structure]

A thermoelectric power generation device related to Embodiment 2 of the present invention is described. It should be noted that Embodiment 2 mainly describes differences from Embodiment 1. In Embodiment 2, the same symbols are given to structures identical or similar to those of Embodiment 1. Further, the description of Embodiment 2 omits descriptions which overlap with that of Embodiment 1.

Figure 8:
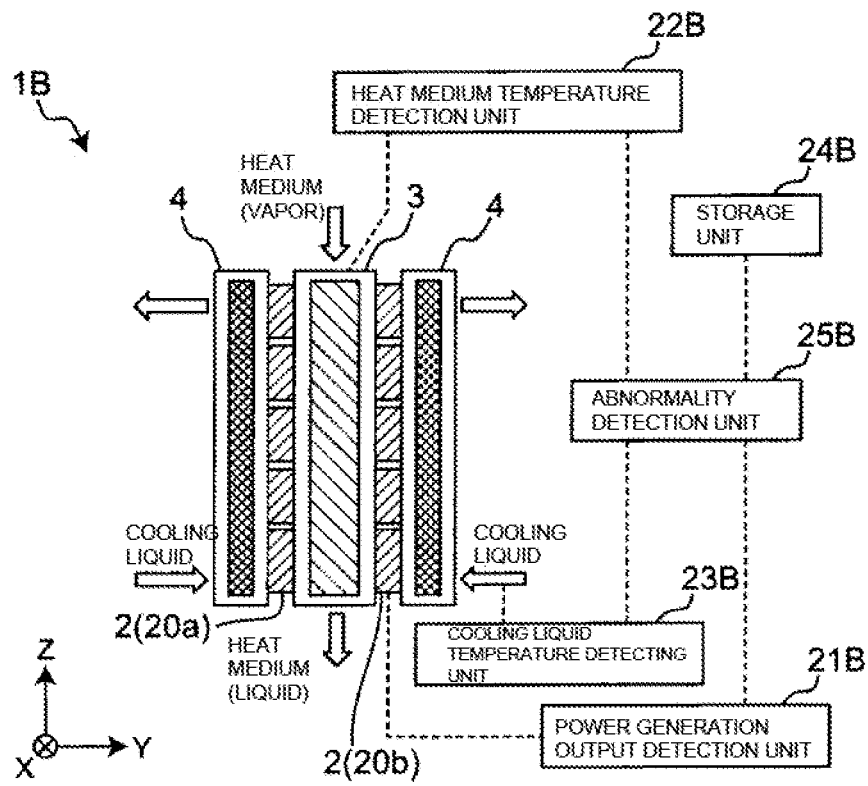
FIG. 8 A diagram showing an abnormality detection structure of a thermoelectric power generation device related to Embodiment 2 of the present invention.

FIG. 8 shows an abnormality detection structure of a thermoelectric power generation device 1B related to Embodiment 2.

Embodiment 2 is different from Embodiment 1 in that the thermoelectric power generation device 1B detects an abnormality of the thermoelectric power generation device 1B, based on whether or not the relationship between the power generation output of the thermoelectric element 2 and the difference between the temperature of the heat medium and the temperature of the cooling liquid is in the normal state.

Specifically, the thermoelectric power generation device 1B includes: a power generation output detection unit 21B, a heat medium temperature detection unit 22B, a cooling liquid temperature detecting unit 23B, a storage unit 24B, and an abnormality detection unit 25B, as an abnormality detection structure.

The power generation output detection unit 21B detects the power generation output of the thermoelectric element 2. The power generation output detection unit 21B is, for example, a voltmeter, an ammeter, an electrometer, and a power generation amount meter. The heat medium temperature detection unit 22B detects the temperature of the heat medium flowing in the heat medium passage of the heating unit 3. The cooling liquid temperature detecting unit 23B detects the temperature of the cooling liquid flowing in the cooling liquid passage of the cooling unit 4. In Embodiment 2, the cooling liquid temperature detecting unit 23B detects the temperature nearby the cooling liquid inflow pipe 41 (see FIG. 3). The heat medium temperature detection unit 22B and the cooling liquid temperature detecting unit 23B are each, for example, a temperature sensor. The storage unit 24B stores, in advance, a relationship (e.g., a relational expression or a map) between the power generation output of the thermoelectric element 2 and a difference between the temperature of the heat medium and the temperature of the cooling liquid, while the thermoelectric power generation device 1B is in a normal state.

Figure 9:
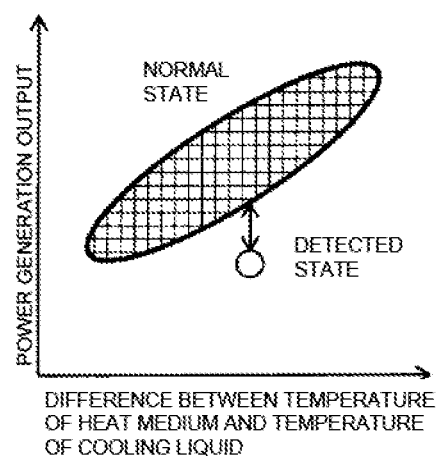
FIG. 9 A graph showing a relationship between the power generation output of the thermoelectric element and a difference between the temperature of a heat medium and the temperature of a cooling liquid, in the normal state and the detected state.

The abnormality detection unit 25B detects that an abnormality is taking place in the thermoelectric power generation device 1B, when the relationship between the power generation output detected by the power generation output detection unit 21B and the difference between the temperature detected by the heat medium temperature detection unit 22B and the temperature detected by the cooling liquid temperature detecting unit 23B is different from the relationship stored in the storage unit 24B. For example, the abnormality detection unit 25B obtains the relationship (detected state) between the power generation output detected by the power generation output detection unit 21B and the difference between the temperature detected by the heat medium temperature detection unit 22B and the temperature detected by the cooling liquid temperature detecting unit 23B. As shown in FIG. 9, the abnormality detection unit 25B detects that an abnormality is taking place in the thermoelectric power generation device 1B, when the detected state obtained is different from the relationship stored in the storage unit 24B, i.e., when the detected state is outside of the range of the normal state.

[Effects]

The thermoelectric power generation device 1B related to Embodiment 2 brings about the following effects.

The thermoelectric power generation device 1B is configured to detect an abnormality in the thermoelectric power generation device 1B, based on whether or not the relationship between the power generation output of the thermoelectric element 2 and a difference between the temperature of the heat medium and the temperature of the cooling liquid is in the normal state. That is, the thermoelectric power generation device 1B is configured to more directly detect the temperature difference by the heat medium temperature detection unit 22B and the cooling liquid temperature detecting unit 23B, for the thermoelectric element 2 that generates power by utilizing the temperature difference. With this structure, an abnormality in the thermoelectric power generation device 1B can be more reliably detected even in cases of utilizing a heat medium that undergoes latent heat transfer, in the heating unit 3.

Embodiment 3

[Overall Structure]

A thermoelectric power generation device related to Embodiment 3 of the present invention is described. It should be noted that Embodiment 3 mainly describes differences from Embodiment 1. In Embodiment 3, the same symbols are given to structures identical or similar to those of Embodiment 1. Further, the description of Embodiment 3 omits descriptions which overlap with that of Embodiment 1.

Figure 10:
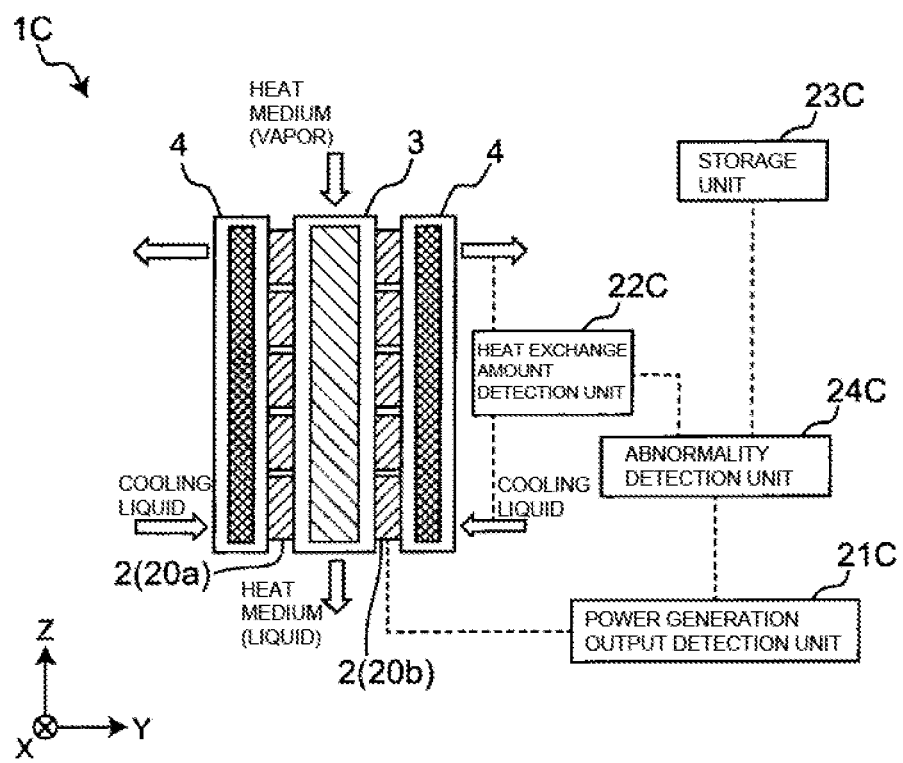
FIG. 10 A diagram showing an abnormality detection structure of a thermoelectric power generation device related to Embodiment 3 of the present invention.

FIG. 10 shows an abnormality detection structure of a thermoelectric power generation device 1C related to Embodiment 3.

Embodiment 3 is different from Embodiment 1 in that the thermoelectric power generation device 1C detects an abnormality of the thermoelectric power generation device 1C, based on whether or not the relationship between the power generation output of the thermoelectric element 2 and the heat exchange amount of the cooling liquid is in the normal state.

Specifically, the thermoelectric power generation device 1B includes: a power generation output detection unit 21C, a heat exchange amount detection unit 22C, a storage unit 23C, and an abnormality detection unit 24C, as an abnormality detection structure.

The power generation output detection unit 21C detects the power generation output of the thermoelectric element 2. The power generation output detection unit 21C is, for example, a voltmeter, an ammeter, an electrometer, and a power generation amount meter. The heat exchange amount detection unit 22C detects a heat exchange amount of the cooling liquid. For example, the heat exchange amount detection unit 22C detects the heat exchange amount of the cooling liquid, based on the flow rate of the cooling liquid flowing in the cooling liquid passage, the specific heat of the cooling liquid, a difference between the temperature nearby the cooling liquid discharge pipe 42 (see FIG. 3) and the temperature nearby the cooling liquid inflow pipe 41 (see FIG. 3), and the like. The storage unit 23C stores, in advance, a relationship (e.g., a relational expression or a map) between the power generation output of the thermoelectric element 2 and the heat exchange amount of the cooling liquid, while the thermoelectric power generation device 1C is in a normal state.

Figure 11:
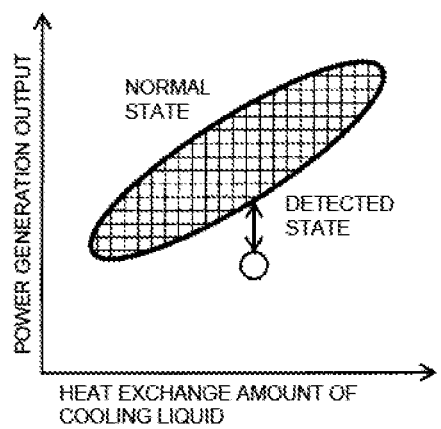
FIG. 11 A graph showing a relationship between the power generation output of the thermoelectric element and a heat exchange amount of a cooling liquid, in the normal state and the detected state.

The abnormality detection unit 24C detects that an abnormality is taking place in the thermoelectric power generation device 1C, when the relationship between the power generation output detected by the power generation output detection unit 21C and the heat exchange amount detected by the heat exchange amount detection unit 22C is different from the relationship stored in the storage unit 23C. For example, the abnormality detection unit 24C obtains the relationship (detected state) between the power generation output detected by the power generation output detection unit 21C and the heat exchange amount detected by the heat exchange amount detection unit 22C. As shown in FIG. 11, the abnormality detection unit 24C detects that an abnormality is taking place in the thermoelectric power generation device 1C, when the detected state obtained is different from the relationship stored in the storage unit 22C, i.e., when the detected state is outside of the range of the normal state.

[Effects]

The thermoelectric power generation device 1C related to Embodiment 3 brings about the following effects.

The thermoelectric power generation device 1C is configured to detect an abnormality in the thermoelectric power generation device 1C, based on whether or not the relationship between the power generation output of the thermoelectric element 2 and the heat exchange amount of the cooling liquid is in the normal state. With this structure, an abnormality in the thermoelectric power generation device 1C can be more reliably detected even in cases of utilizing a heat medium that undergoes latent heat transfer, in the heating unit 3.

Embodiment 4

[Overall Structure]

A thermoelectric power generation device related to Embodiment 4 of the present invention is described. It should be noted that Embodiment 4 mainly describes differences from Embodiment 1. In Embodiment 4, the same symbols are given to structures identical or similar to those of Embodiment 1. Further, the description of Embodiment 4 omits descriptions which overlap with that of Embodiment 1.

Figure 12:
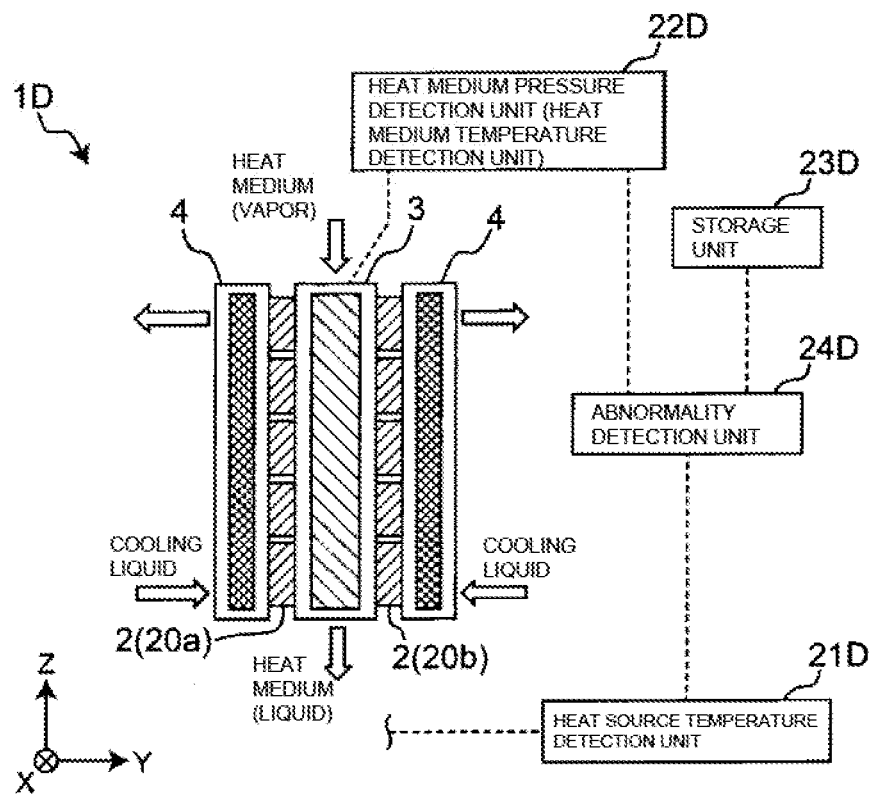
FIG. 12 A diagram showing an abnormality detection structure of a thermoelectric power generation device related to Embodiment 4 of the present invention.

FIG. 12 shows an abnormality detection structure of a thermoelectric power generation device 1D related to Embodiment 4.

Embodiment 4 is different from Embodiment 1 in that the thermoelectric power generation device 1D detects an abnormality of the thermoelectric power generation device 1D, based on whether or not the relationship between a heat source temperature (temperature in the flow path 5 indicated in FIG. 1A) and the pressure of the heat medium is in the normal state.

Specifically, the thermoelectric power generation device 1D includes: a heat source temperature detection unit 21D, a heat medium pressure detection unit 22D, a storage unit 23D, and an abnormality detection unit 24D, as an abnormality detection structure.

The heat source temperature detection unit 21D detects the temperature in the flow path 5 (see FIG. 1A) to serve as the heat source. The heat source temperature detection unit 21D is, for example, temperature sensor. The heat medium pressure detection unit 22D detects the pressure of the heat medium flowing in the heat medium passage of the heating unit 3. The heat medium pressure detection unit 22D is, for example, a pressure sensor. The storage unit 23D stores, in advance, a relationship (e.g., a relational expression or a map) between the heat source temperature and the pressure of the heat medium, while the thermoelectric power generation device 1D is in a normal state.

Figure 13:
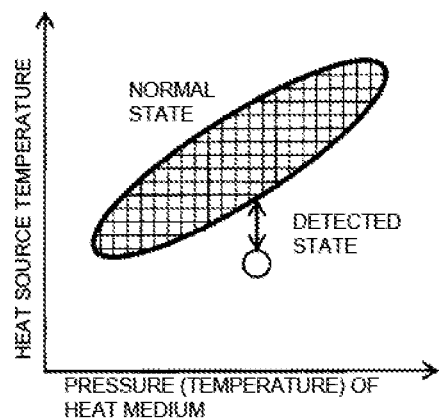
FIG. 13 A graph showing a relationship between the heat source temperature and the pressure (or temperature) of the heat medium, in the normal state and the detected state.

The abnormality detection unit 24D detects that an abnormality is taking place in the thermoelectric power generation device 1C, when the relationship between the temperature detected by the heat source temperature detection unit 21D and the pressure detected by the heat medium pressure detection unit 22D is different from the relationship stored in the storage unit 23D. For example, the abnormality detection unit 24D obtains the relationship (detected state) between the temperature detected by the heat source temperature detection unit 21D and the pressure detected by the heat medium pressure detection unit 22D. As shown in FIG. 13, the abnormality detection unit 24D detects that an abnormality is taking place in the thermoelectric power generation device 1D, when the detected state obtained is different from the relationship stored in the storage unit 23D, i.e., when the detected state is outside of the range of the normal state.

[Effects]

The thermoelectric power generation device 1D related to Embodiment 4 brings about the following effects.

The pressure of the heat medium should be in a correlation with the heat source temperature. Therefore, the thermoelectric power generation device 1D is configured to detect an abnormality in the thermoelectric power generation device 1D, based on whether or not the relationship between the power generation output of the thermoelectric element 2 and the heat exchange amount of the cooling liquid is in the normal state. With this structure, an abnormality in the thermoelectric power generation device 1D can be more reliably detected even in cases of utilizing a heat medium that undergoes latent heat transfer, in the heating unit 3. For example, an excessive adhesion of soot to the heat transfer pipe 6 can be detected with this structure. That is, if the soot excessively adheres to the heat transfer pipe 6, the heat medium passing the heat transfer pipe 6 receives less quantity of heat from the heat source, which causes an excessive drop of the pressure of the heat medium.

It should be noted that the power generation output of the thermoelectric element 2 may be slightly different in each thermoelectric power generation device 1D, due to individual difference of the thermoelectric power generation device 1D. The heat source temperature and the pressure of the heat medium on the other hand are not influenced by the individual difference of the thermoelectric power generation device 1D. Therefore, the above structure can eliminate the need for taking into account the individual difference of the thermoelectric power generation device 1D.

Embodiment 5

[Overall Structure]

A thermoelectric power generation device related to Embodiment 5 of the present invention is described. It should be noted that Embodiment 5 mainly describes differences from Embodiment 1. In Embodiment 5, the same symbols are given to structures identical or similar to those of Embodiment 1. Further, the description of Embodiment 5 omits descriptions which overlap with that of Embodiment 1.

Figure 14:
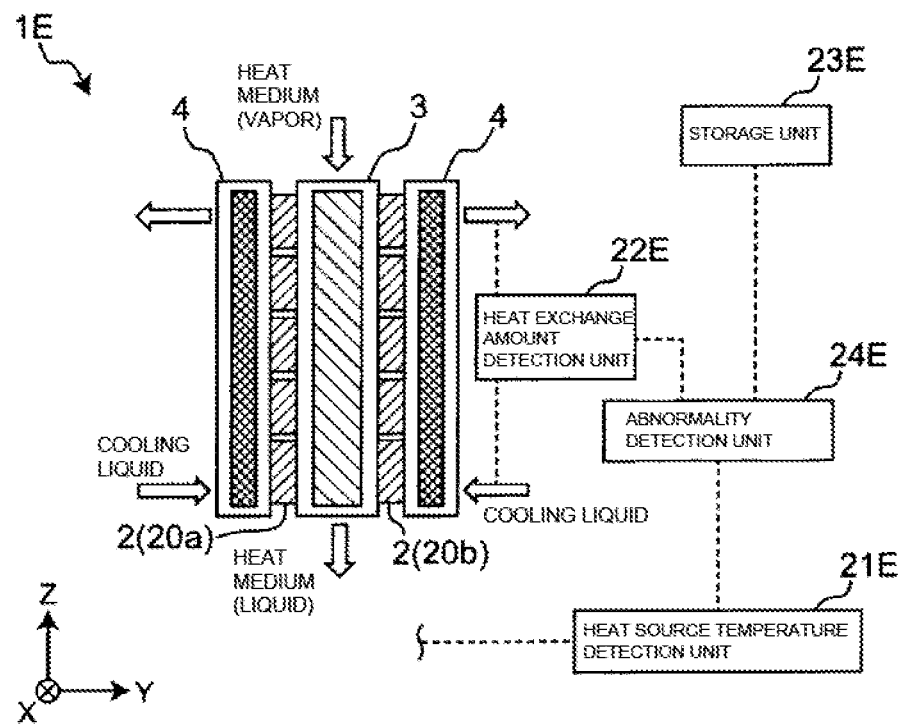
FIG. 14 A diagram showing an abnormality detection structure of a thermoelectric power generation device related to Embodiment 5 of the present invention.

FIG. 14 shows an abnormality detection structure of a thermoelectric power generation device 1E related to Embodiment 5.

Embodiment 5 is different from Embodiment 1 in that the thermoelectric power generation device 1E detects an abnormality of the thermoelectric power generation device 1E, based on whether or not the relationship between a heat source temperature (temperature in the flow path 5 indicated in FIG. 1A) and the heat exchange amount of the cooling liquid is in the normal state.

Specifically, the thermoelectric power generation device 1E includes: a heat source temperature detection unit 21E, a heat exchange amount detection unit 22E, a storage unit 23E, and an abnormality detection unit 24E, as an abnormality detection structure.

The heat source temperature detection unit 21E detects the temperature in the flow path 5 (see FIG. 1A) to serve as the heat source. The heat source temperature detection unit 21E is, for example, temperature sensor. The heat exchange amount detection unit 22E detects a heat exchange amount of the cooling liquid. For example, the heat exchange amount detection unit 22E detects the heat exchange amount of the cooling liquid, based on the flow rate of the cooling liquid flowing in the cooling liquid passage, the specific heat of the cooling liquid, a difference between the temperature nearby the cooling liquid discharge pipe 42 (see FIG. 3) and the temperature nearby the cooling liquid inflow pipe 41 (see FIG. 3), and the like. The storage unit 23E stores, in advance, a relationship (e.g., a relational expression or a map) between the heat source temperature and the heat exchange amount of the cooling liquid, while the thermoelectric power generation device 1E is in a normal state.

Figure 15:
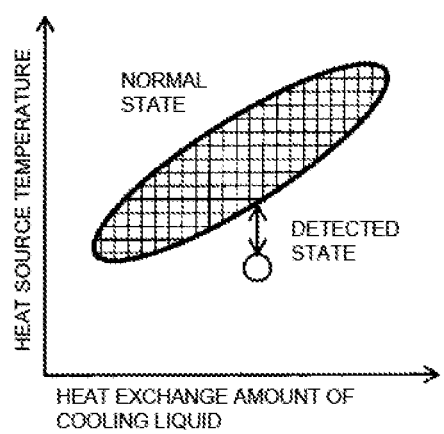
FIG. 15 A graph showing a relationship between the heat source temperature and a heat exchange amount of a cooling liquid, in the normal state and the detected state.

The abnormality detection unit 24E detects that an abnormality is taking place in the thermoelectric power generation device 1E, when the relationship between the heat source temperature detected by the heat source temperature detection unit 21E and the heat exchange amount detected by the heat exchange amount detection unit 22E is different from the relationship stored in the storage unit 23E. For example, the abnormality detection unit 24E obtains the relationship (detected state) between the temperature detected by the heat source temperature detection unit 21E and the heat exchange amount detected by the heat exchange amount detection unit 22E. As shown in FIG. 15, the abnormality detection unit 24E detects that an abnormality is taking place in the thermoelectric power generation device 1E, when the detected state obtained is different from the relationship stored in the storage unit 23E, i.e., when the detected state is outside of the range of the normal state.

[Effects]

The thermoelectric power generation device 1E related to Embodiment 5 brings about the following effects.

The heat exchange amount of the cooling liquid should be in a correlation with the heat source temperature. Therefore, the thermoelectric power generation device 1E is configured to detect an abnormality in the thermoelectric power generation device 1E, based on whether or not the relationship between the heat source temperature and the heat exchange amount of the cooling liquid is in the normal state. With this structure, an abnormality in the thermoelectric power generation device 1E can be more reliably detected even in cases of utilizing a heat medium that undergoes latent heat transfer, in the heating unit 3. For example, an excessive adhesion of soot to the heat transfer pipe 6 can be detected with this structure. That is, if the soot excessively adheres to the heat transfer pipe 6, the heat medium passing the heat transfer pipe 6 receives less quantity of heat from the heat source. As a result, the temperature difference between both sides of the thermoelectric element 2 decreases, and the heat exchange amount of the cooling liquid excessively drops.

It should be noted that the power generation output of the thermoelectric element 2 may be slightly different in each thermoelectric power generation device 1E, due to individual difference of the thermoelectric power generation device 1E. The heat source temperature and the heat exchange amount of the cooling liquid on the other hand are not influenced by the individual difference of the thermoelectric power generation device 1E. Therefore, the above structure can eliminate the need for taking into account the individual difference of the thermoelectric power generation device 1E.

Embodiment 6

[Overall Structure]

A thermoelectric power generation device related to Embodiment 6 of the present invention is described. It should be noted that Embodiment 6 mainly describes differences from Embodiment 1. In Embodiment 6, the same symbols are given to structures identical or similar to those of Embodiment 1. Further, the description of Embodiment 6 omits descriptions which overlap with that of Embodiment 1.

Figure 16:
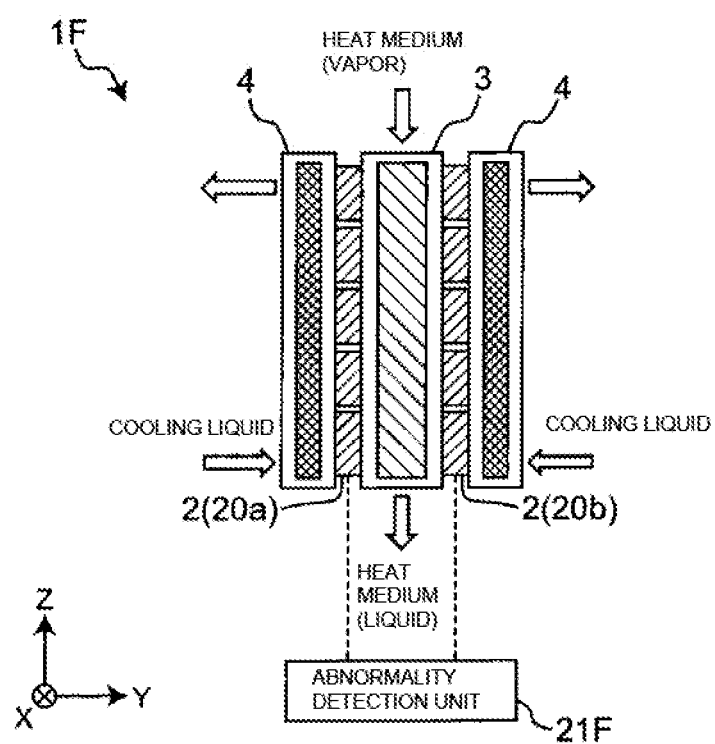
FIG. 16 A diagram showing an abnormality detection structure of a thermoelectric power generation device related to Embodiment 6 of the present invention.

FIG. 16 shows an abnormality detection structure of a thermoelectric power generation device 1F related to Embodiment 6.

Embodiment 6 is different from Embodiment 1 in that the thermoelectric power generation device 1F detects an abnormality of the thermoelectric power generation device 1F, based on a difference between the power generation outputs from a pair of thermoelectric elements 2 (20a, 20b).

Specifically, the thermoelectric power generation device 1F includes, as an abnormality detection structure, an abnormality detection unit 21F configured to detect that an abnormality is taking place in the thermoelectric power generation device 1F, when the difference between a power generation output of one of the pair of thermoelectric elements 2 and a power generation output of the other one of the pair of thermoelectric elements 2 is equal to or higher than a predetermined threshold value. The abnormality detection unit 21F includes, for example, a voltmeter, an ammeter, an electrometer, and a power generation amount meter.

[Effects]

The thermoelectric power generation device 1F related to Embodiment 6 brings about the following effects.

Since the pair of thermoelectric elements 2 share the heating unit 3, their power generation outputs should be the same, if the cooling liquid supplied to the cooling unit 4 is the same. Therefore, the thermoelectric power generation device 1F is configured to detect that an abnormality is taking place in the thermoelectric power generation device 1F, when the difference between the power generation outputs of the pair of the thermoelectric elements 2 is greater than an expectable error (predetermined threshold value). With this structure, an abnormality in the thermoelectric power generation device 1F can be more reliably detected even in cases of utilizing a heat medium that undergoes latent heat transfer, in the heating unit 3. Further, in which one of the pair of thermoelectric elements 2 the abnormality is taking place can be recognized. Further, unlike the other embodiments, the above structure does not require a heat medium pressure detection unit, a storage unit, and the like, because it only compares the power generation outputs of the pair of the thermoelectric elements 2.

Embodiment 7

[Overall Structure]

A thermoelectric power generation device related to Embodiment 7 of the present invention is described. It should be noted that Embodiment 7 mainly describes differences from Embodiment 1. In Embodiment 7, the same symbols are given to structures identical or similar to those of Embodiment 1. Further, the description of Embodiment 7 omits descriptions which overlap with that of Embodiment 1.

Figure 17:
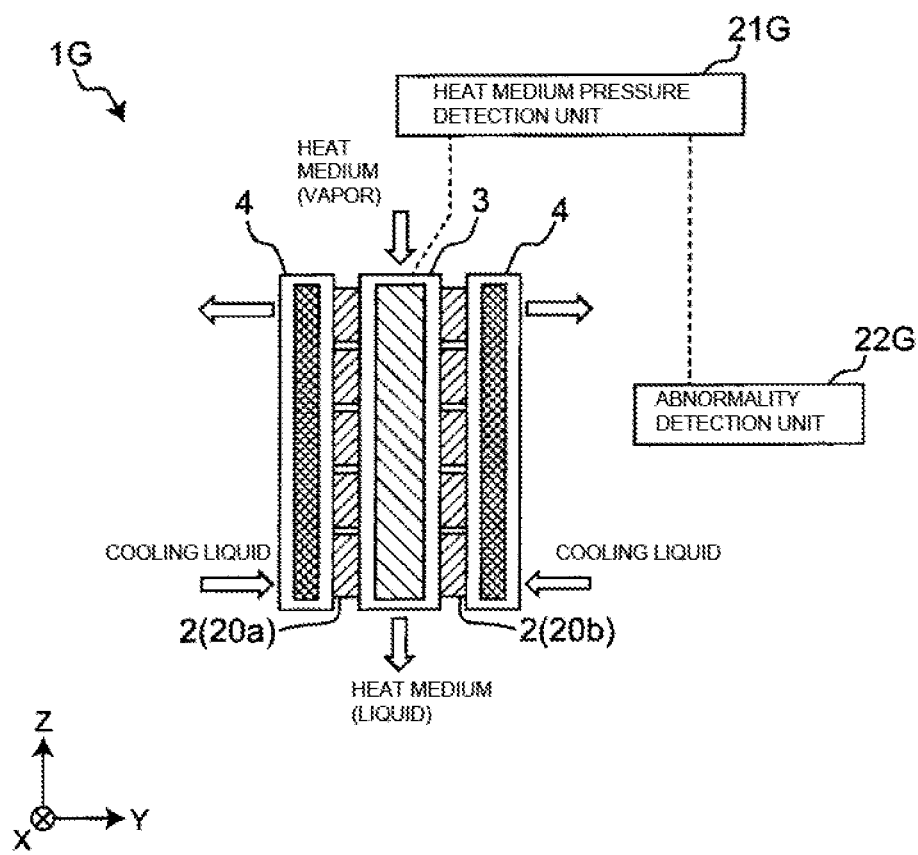
FIG. 17 A diagram showing an abnormality detection structure of a thermoelectric power generation device related to Embodiment 7 of the present invention.

FIG. 17 shows an abnormality detection structure of a thermoelectric power generation device 1G related to Embodiment 7.

Embodiment 7 is different from Embodiment 1 in that the thermoelectric power generation device 1G detects an abnormality of the thermoelectric power generation device 1G, based on the pressure of the heat medium.

Specifically, the thermoelectric power generation device 1G includes: a heat medium pressure detection unit 21G and an abnormality detection unit 22G, as an abnormality detection structure.

The heat medium pressure detection unit 21G detects the pressure of the heat medium flowing in the heat medium passage of the heating unit 3. The heat medium pressure detection unit 21G is, for example, a pressure sensor. The abnormality detection unit 22G detects that an abnormality is taking place in the thermoelectric power generation device 1G, when a converted saturation temperature based on the pressure detected by the heat medium pressure detection unit 21G exceeds a predetermined threshold value. For example, where the predetermined threshold value is 200 degrees, and the pressure detected by the heat medium pressure detection unit 21G is 1.6 Mpa, and the converted saturation temperature of the heat medium based on the pressure is 210 degrees, the abnormality detection unit 22G detects that an abnormality is taking place in the thermoelectric power generation device 1G.

[Effects]

The thermoelectric power generation device 1G related to Embodiment 7 brings about the following effects.

If the temperature of the heat medium in the heat medium passage of the heating unit 3 is excessively high, the thermoelectric element 2 may be overheated and may fail due to the heat. The temperature of the heat medium flowing in the heat medium passage can be easily detected by letting the heat medium to partially flow into a branch pipe connected to the heat medium passage, and detecting the temperature of the part of the heat medium. In this case however, the heat medium may be cooled in the process of passing the branch pipe, and the temperature of the heat medium may not be accurately detected. On the other hand, the pressure of the heat medium is the same whether it is in the heat medium passage or in the branch pipe. Further, as hereinabove described, the pressure of the heat medium is proportional to the temperature of the heat medium. In view of this, the thermoelectric power generation device 1G is configured to detect an abnormality in the thermoelectric power generation device 1G based on the pressure of the heat medium. With this structure, an abnormality (overheating) in the thermoelectric power generation device 1G can be more reliably detected even in cases of utilizing a heat medium that undergoes latent heat transfer, in the heating unit 3.

It should be noted that the effects of the embodiments described above can be brought about by suitably combining any of the various embodiments described above.

Although each of the above embodiments describes the present invention with a certain level of details, the details of the structures disclosed in these embodiments are modifiable. Further, modification in combinations and arrangement of elements in each embodiment are possible without departing from the scope and spirit of the present disclosure.

INDUSTRIAL APPLICABILITY

Since the present invention can more reliably detect an abnormality, the present invention is useful for a thermoelectric power generation device which generates power by utilizing the heat of a high temperature fluid flowing in an exhaust gas duct and the like of an engine.

REFERENCE SIGNS LIST 1A, 1B, 1C, 1D, 1E, 1F, 1G thermoelectric power generation device
10 thermoelectric power generation system
11 inverter
12 electric load
13 tank
14 vacuum pump
15 heat exchanger
16 cooling installation
2 thermoelectric element
20a, 20b thermoelectric module
3 heating unit
4 cooling unit
40 cooling liquid passage
41 cooling liquid inflow pipe
42 cooling liquid discharge pipe
5 flow path
6 heat transfer pipe
61 tubular member
62 bent portion
63, 64 open end portion
7 circulation path
7a, 7b internal space
21A power generation output detection unit
22A heat medium pressure detection unit
23A storage unit
24A abnormality detection unit
21B power generation output detection unit
22B heat medium temperature detection unit
23B cooling liquid temperature detecting unit
24B storage unit
25B abnormality detection unit
21C power generation output detection unit
22C heat exchange amount detection unit
23C storage unit
24C abnormality detection unit
21D heat source temperature detection unit
22D heat medium pressure detection unit
23D storage unit
24D abnormality detection unit
21E heat source temperature detection unit
22E heat exchange amount detection unit
23E storage unit
24E abnormality detection unit
21F abnormality detection unit
21G heat medium pressure detection unit
22G abnormality detection unit
L1, L2, L3 heat medium line
L4, L5 cooling liquid line

The invention claimed is:

1. A thermoelectric power generation device comprising:
a heating unit having a heat medium passage in which a heat medium flows;
a cooling unit having a cooling liquid passage in which a cooling liquid flows; and
a thermoelectric element having the heating unit on one side of the thermoelectric element and the cooling unit on another side of the thermoelectric element, the thermoelectric element configured to generate power by utilizing a temperature difference between a condensation temperature of the heat medium that undergoes latent heat transfer in the heat medium passage and a temperature of the cooling liquid; and
a heat transfer pipe distinct from the heating unit and arranged in a flow path to serve as a heat source, and communicated with the heat medium passage to form a circulation path in which the heat medium is circulated, the thermoelectric power generation device further comprising:
a power generation output detection unit configured to detect a power generation output of the thermoelectric element;
a heat medium temperature detection unit configured to detect a temperature of the heat medium;
a cooling liquid temperature detecting unit configured to detect a temperature of the cooling liquid;
a storage unit for storing, in advance, a relationship between a power generation output of the thermoelectric element and a difference between the temperature of the heat medium and the temperature of the cooling liquid, when the thermoelectric power generation device is in a normal state; and
an abnormality detection unit configured to detect that an abnormality is taking place in the thermoelectric power generation device, when a relationship between the power generation output detected by the power generation output detection unit and the difference between the temperature detected by the heat medium temperature detection unit and the temperature detected by the cooling liquid temperature detecting unit is different from the relationship stored in the storage unit.

2. The thermoelectric power generation device according to claim 1, wherein an entirety of the heating unit is arranged outside of the flow path.

3. The thermoelectric power generation device according to claim 1, wherein a first end of the heat transfer pipe is coupled to the heating unit.

4. The thermoelectric power generation device according to claim 3, wherein a second end of the heat transfer pipe is coupled to the heating unit.

5. The thermoelectric power generation device according to claim 1, wherein the flow path includes a duct.

6. The thermoelectric power generation device according to claim 5, wherein the duct is configured for a flow of exhaust gas.

7. The thermoelectric power generation device according to claim 1, wherein the circulation path includes a first portion associated with the heating unit and a second portion associated with the heat transfer pipe.

8. The thermoelectric power generation device according to claim 7, wherein the heat medium in the first portion of the circulation path is configured to be heated based on a high temperature fluid flowing in the flow path.

9. The thermoelectric power generation device according to claim 7, wherein the first portion of the circulation path is distinct from the second portion of the circulation path.

10. The thermoelectric power generation device according to claim 1, wherein the heating unit, the cooling unit, and the thermoelectric element are arranged outside of the flow path.

11. The thermoelectric power generation device according to claim 1, wherein the circulation path is a closed path.

* * * * *